United States Patent
Cameron et al.

(10) Patent No.: US 7,447,981 B2
(45) Date of Patent: Nov. 4, 2008

(54) SYSTEM CORRECTING RANDOM AND/OR BURST ERRORS USING RS (REED-SOLOMON) CODE, TURBO/LDPC (LOW DENSITY PARITY CHECK) CODE AND CONVOLUTIONAL INTERLEAVE

(75) Inventors: Kelly Brian Cameron, Irvine, CA (US); Ba-Zhong Shen, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 547 days.

(21) Appl. No.: 11/292,134

(22) Filed: Dec. 1, 2005

(65) Prior Publication Data
US 2006/0224935 A1 Oct. 5, 2006

Related U.S. Application Data

(60) Provisional application No. 60/667,408, filed on Apr. 1, 2005.

(51) Int. Cl.
*H03M 13/00* (2006.01)
*G06F 11/00* (2006.01)

(52) U.S. Cl. ...................... 714/784; 714/800
(58) Field of Classification Search ............ 714/784, 714/701, 746, 786, 800, 375, 262, 265
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,406,570 A | 4/1995 | Berrou et al. | |
| 5,446,747 A | 8/1995 | Berrou | |
| 5,563,897 A | 10/1996 | Pyndiah et al. | |
| 6,044,116 A * | 3/2000 | Wang | 375/265 |
| 6,065,147 A | 5/2000 | Pyndiah et al. | |

(Continued)

FOREIGN PATENT DOCUMENTS

EP   0 735 696 A2   10/1996

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—Shelly A Chase
(74) *Attorney, Agent, or Firm*—Garlick Harrison & Markison; Shayne X. Short

(57) ABSTRACT

System correcting random and/or burst errors using RS (Reed-Solomon) code, turbo/LDPC (Low Density Parity Check) code and convolutional interleave. A novel approach is presented that combines different coding types within a communication system to perform various types of error correction. This combination of accommodating different coding types may be employed at either end of a communication channel (e.g., at a transmitter end when performing encoding and/or at a receiver end when performing decoding). By combining different coding types within a communication system, the error correcting capabilities of the overall system is significantly improved. The appropriate combination of turbo code and/or LDPC code along with RS code allows for error correction or various error types including random error and burst error (or impulse noise).

20 Claims, 6 Drawing Sheets

U.S. PATENT DOCUMENTS

| | | | |
|---|---|---|---|
| 6,119,264 | A | 9/2000 | Berrou et al. |
| 6,122,763 | A | 9/2000 | Pyndiah et al. |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 6,704,368 | B1 * | 3/2004 | Nefedov .............. 375/265 |
| 6,769,093 | B1 * | 7/2004 | Krieger .............. 714/814 |
| 6,903,665 | B2 * | 6/2005 | Akhter et al. .......... 341/50 |
| 2003/0104788 | A1 | 6/2003 | Kim |

FOREIGN PATENT DOCUMENTS

| | | |
|---|---|---|
| EP | 0 735 696 A3 | 1/1999 |
| FR | 91 05278 A1 | 10/1992 |

OTHER PUBLICATIONS

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

* cited by examiner

SYSTEM CORRECTING RANDOM AND/OR BURST ERRORS USING RS (REED-SOLOMON) CODE, TURBO/LDPC (LOW DENSITY PARITY CHECK) CODE AND CONVOLUTIONAL INTERLEAVE

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/667,408, entitled "System correcting both random and/or burst errors using RS (Reed-Solomon) code, turbo/LDPC (Low Density Parity Check) code and convolutional interleave," filed Friday, Apr. 1, 2005 (Apr. 01, 2005), pending.

INCORPORATION BY REFERENCE

The following U.S. Utility Patent Application is hereby incorporated herein by reference in its entirety and made part of the present U.S. Utility Patent Application for all purposes:

1. U.S. Utility Patent Application Ser. No. 11/292,133, entitled "System correcting random and/or burst errors using RS (Reed-Solomon) code, turbo/LDPC (Low Density Parity Check) code and convolutional interleave," filed Thursday, Dec. 1, 2005 (Dec. 01, 2005), concurrently, pending.

BACKGROUND OF THE INVENTION

1. Technical Field of the Invention

The invention relates generally to communication systems; and, more particularly, it relates to encoding and/or decoding of information within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. In addition, other types of communication systems operate using other types of codes such as RS (Reed-Solomon) codes. Each of these different types of communication systems is able to achieve relatively low BERs (Bit Error Rates) under appropriate conditions.

A continual and primary directive in this area of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

Each of these different types of codes has certain limitations and best capabilities to accommodate certain types of errors that may occur within a communication system. Oftentimes, certain of these codes are specifically selected and employed within a communication system type that suffers from deleterious effects and errors for which the code is most capable to correct. For example, some types of errors that may occur in various types of communication systems include burst errors (e.g., relatively localized in time) and/or random errors (e.g., randomly distributed across a portion of data). Turbo codes and LDPC codes are well suited to correct random errors, and RS codes are well suited to correct burst error (or impulse noise). Again, each of these various codes has certain capabilities and abilities to correct certain types of errors. However, there are instances where certain types of communication systems may undesirably experience many types of errors including both random and burst errors. Clearly, there is a need in the art for some alternative coding types that are capable to correct a wider range of error types including the capability to correct different types of errors that may occur within various locations of a communication system.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Novel approaches of signal processing that may be performed within various communication devices, or according to certain signal processing methods, are described herein. These signal processing approaches may be implemented as encoding and/or decoding within various communication devices that may be implemented in a variety of communication systems including satellite communication systems, microwave communication systems, wireless communication systems, wired communication systems, fiber-optic communication systems, as well as other types of communication systems.

In some instances, these new approaches to signal processing may be applied to cable or DSL (Digital Subscriber Line) downstream or upstream transmissions within those corresponding communication systems types. Generally speaking, these new approaches to signal processing may be applied to any communication system that may suffer from the deleterious effects of either random and/or burst errors. Sometimes, certain communication systems suffer from both random and burst errors, and various aspects of the invention can assist in minimizing, if not eliminating completely, these undesirable effects.

Figure 1:
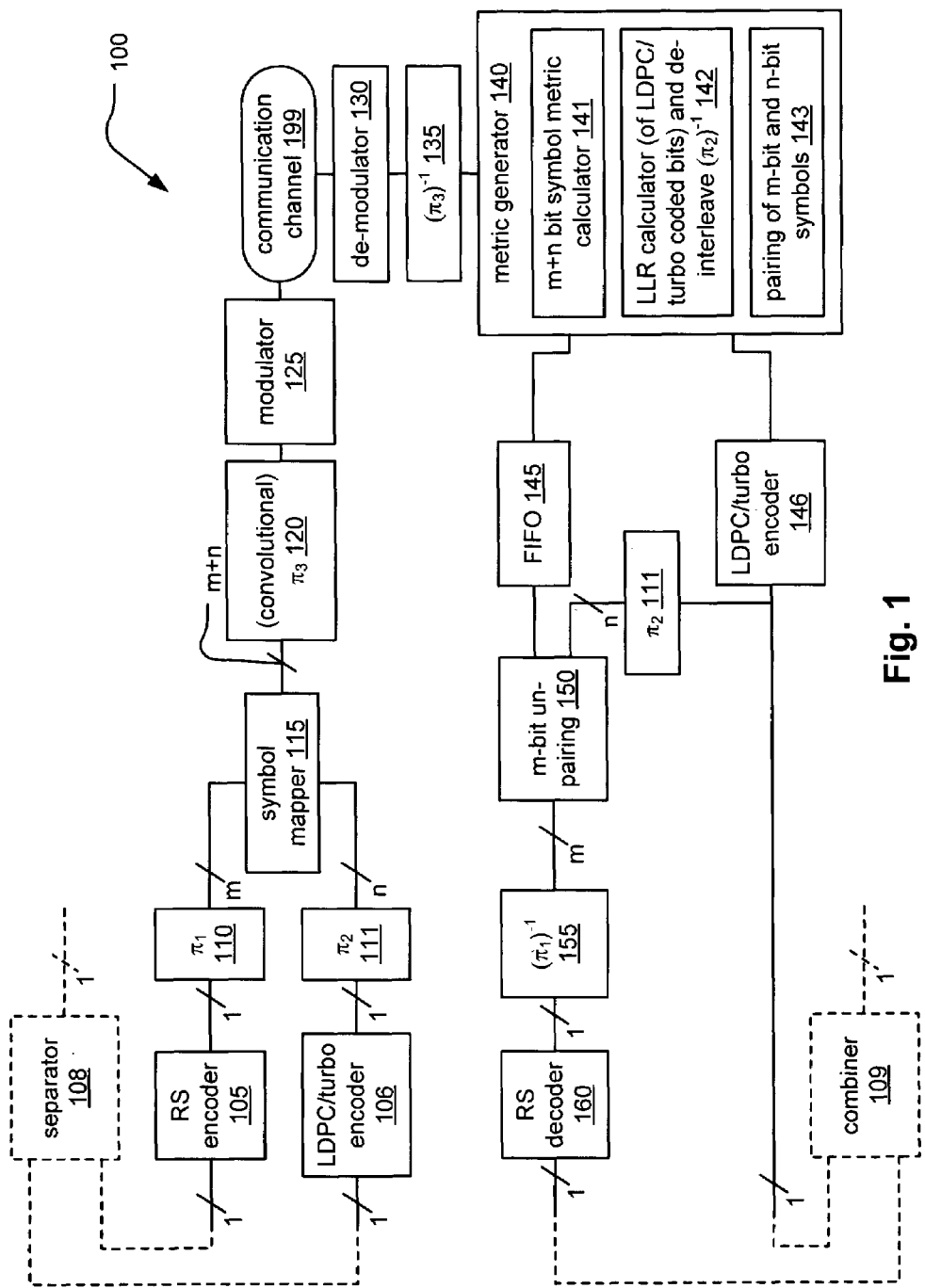
FIG. 1 and FIG. 2 are diagrams illustrating various embodiments of communication systems that may be built in accordance with certain aspects of the invention.
Figure 2:
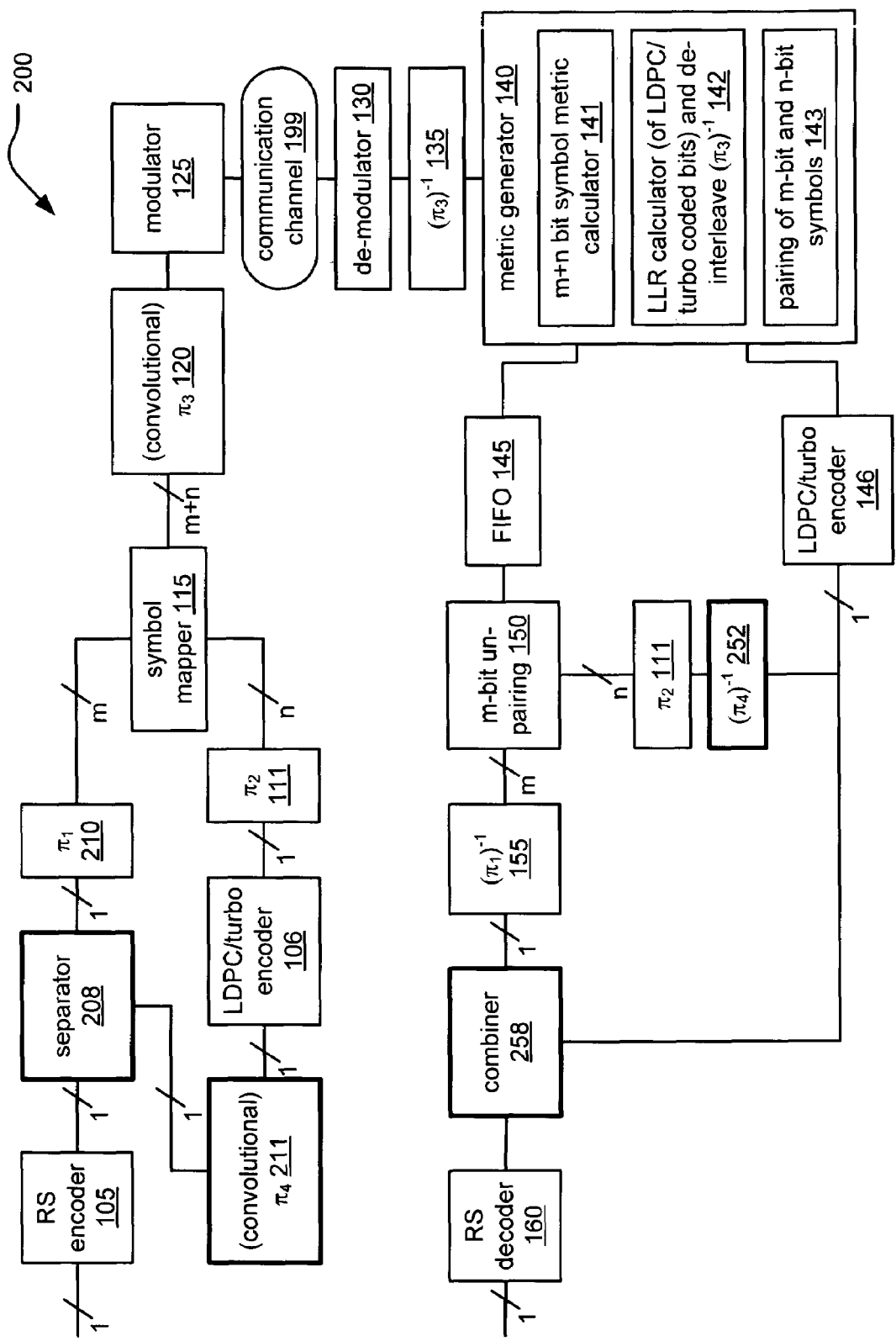

FIG. 1 and FIG. 2 are diagrams illustrating various embodiments of communication systems that may be built in accordance with certain aspects of the invention.

Referring to FIG. 1, this communication system 100 shows one possible embodiment that is operable to combine the beneficial error correction capabilities provided by both RS (Reed-Solomon) code and either turbo code or LDPC (Low Density Parity Check) code.

In this communication system 100, before being sent to each of the respective types of encoders, an input bit stream (e.g., an information sequence) may be divided into two parts as shown within the separator 108. One part of the input bit stream is sent to a turbo or LDPC encoder (shown as LDPC/turbo encoder 106). The other part of the input bit stream is sent to a RS encoder 105. Either the LDPC code or the turbo code, whichever one is employed within the LDPC/turbo encoder 106, can insure that the communication system that is working at a relatively and sufficiently low SNR (Signal to Noise Ratio) and has the ability to perform error correction of random errors.

In some prior art approaches, the second part of input bit stream is usually merely protected by Euclidean distance due to the constellation shape and mapping that is employed within the selected modulation type (e.g., PSK (Phase Shift Key) or QAM (Quadrature Amplitude Modulation)). However, this prior art approach generally may not provide sufficient, if any, protection from burst error (or impulse noise) that may be experienced in the communication system.

To provide for better error correction capability against such burst errors (or impulse noise), a novel approach is presented herein such that one portion of the input bit stream is encoded using the RS encoder 105 thereby generating a RS coded bit stream. One of the benefits of using RS encoding is that the corresponding RS decoding may be implemented using a relatively low complexity decoder. The other portion of the input bit stream is encoded using the LDPC/turbo encoder 106 thereby generating an LDPC or turbo coded bit stream.

Each of these encoded information sequences (e.g., the RS coded bit stream and the LDPC or turbo coded bit stream) are thereafter interleaved thereby generating an m-bit symbol sequence and an n-bit symbol sequence. This may be performed using a first interleaver, $\pi_1$ 110 and using a second interleaver $\pi_2$ 111, respectively. After undergoing the interleaving, the m-bit symbol sequence may be implemented as m-bits MSB (Most Significant Bit), and the m-bit symbol sequence may be implemented as n-bits LSB (Least Significant Bit), respectively.

When combined, the m-bit symbol sequence and the n-bit symbol sequence form a (m+n)-bit symbol sequence. This (m+n)-bit symbol sequence is provided to a symbol mapper 115 that is operable to map the (m+n)-bit symbols to a constellation signal thereby generating a sequence of discrete valued modulation symbols. Thereafter, the signals are scrambled using a convolutional interleaver, $\pi_3$ 120. Then, this signal is provided to a modulator 125 that is operable to transform the scrambled sequence of discrete valued modulation symbols into a continuous time transmit signal that comports with a communication channel 199. The modulator 125 then launches the continuous time transmit signal into the communication channel.

Oftentimes, it is when the signal is passing through the communication channel 199 that it incurs deleterious effects that are manifested as random and/or burst errors in the signal when processed at the other end of the communication channel.

On the receiver end of the communication channel 199, a de-modulator 130 is operable to receive a continuous time receive signal from the communication channel 199. This continuous time receive signal may be viewed as a version of the continuous time transmit signal after having undergone any alteration or modification within the communication system 199. The de-modulator 130 is also operable to transform the continuous time receive signal from a form that comports with the communication channel 100 to a scrambled sequence of discrete valued modulation symbols. A convolutional de-interleaver, $(\pi_3)^{-1}$ 135 is then operable to de-interleave the scrambled sequence of discrete valued modulation symbols thereby generating a sequence of discrete valued modulation symbols. This corresponding convolutional de-interleaver, $(\pi_3)^{-1}$ 135 also helps to spread any burst errors that have been incurred during transmission across the communication channel. In this way, the communication system 100 is protected from random errors as well as burst errors.

This sequence of discrete valued modulation symbols is then provided to a metric generator 140. The metric generator 140 several functions including calculating symbol-metrics for each m+n bit symbol of the sequence of discrete valued modulation symbols that is provided thereto as shown in a block 141. Then, based on each possible value of n bits of the m+n bit symbol, the metric generator 140 is operable to pair a corresponding value of m bits having a highest likelihood indicating correspondence to that particular value of n bits as shown in a block 143. This resultant is then provided to a FIFO (First-In First-Out) buffer 145.

The metric generator 140 is also operable to de-interleave the m+n bit symbol (using a de-interleave, $(\pi_2)^{-1}$) thereby generating a bit stream corresponding to n bits of the m+n bit symbol. After having performed this de-interleaving, the metric generator is also operable to compute a LLR (Log-Likelihood Ratio) for each bit of this bit stream corresponding to the n bits of the m+n bit symbol thereby generating soft information corresponding to the n bits of the m+n bit symbol, as shown in a block 142. This LLR/soft information determination is performed with respect to the corresponding LDPC code or turbo code by which the m+n bit symbol was originally encoded at the transmitter end of the communication channel.

The FIFO buffer 145 is operable to queue the pairings of each possible value of n bits with its corresponding value of m bits having the highest likelihood that has been determined in the block 142 of the metric generator 140.

Either an LDPC decoder or a turbo decoder (shown as LDPC/turbo decoder 146) is then operable to decode the soft information corresponding to the n bits of the m+n bit symbol according to either the LDPC code or the turbo code thereby generating an LDPC or turbo decoded bit stream. This is then provided to an interleaver, $\pi_2$ 111 (which may be viewed as another interleaver that performs the very same interleaving as the other instantiation of the interleaver, $\pi_2$ 111) that is operable to interleave the LDPC or turbo decoded bit stream thereby generating an n-bit symbol sequence.

This n-bit symbol sequence and the output from the FIFO buffer 145 are then provided an m-bit un-pairing functional block 150. This m-bit un-pairing functional block 150 is operable to select an m-bit symbol sequence corresponding to the m+n bit symbol based the n-bit symbol sequence. This m-bit un-pairing functional block 150 may also be viewed as being operable to estimate the m-bit MSB using the all possible m-bit MSB information, namely, the pairings provided by block 143 of the metric generator 140, as well as the m+n bit symbol metrics calculated in the block 141 of the metric generator 140 as well as the estimated bit information (i.e., the decoded LDPC or turbo decoded bit stream) obtained by iterative LDPC/turbo decoder 146. The output of the m-bit un-pairing functional block 150 may then be viewed as being an m-bit symbol sequence. A de-interleaver, $(\pi_1)^{-1}$ 155 is then operable to de-interleave the m-bit symbol sequence thereby generating a bit stream that is then provided to a RS decoder 160. The RS decoder is operable to decode this bit stream thereby generating a RS decoded bit stream.

In some cases, if the burst error is not a significant problem, the RS encoder 105 and the RS decoder 160 may be omitted. In addition, a design may be implemented such that the functionality and processing of the RS encoder 105 and the RS decoder 160 is only selected as being enabled when undesirable burst error exceeds a particular threshold which may be predetermined or adaptively determined.

In some embodiments, in an analogous manner to how an input bit stream is originally separated into two separate bit streams (e.g., using the separator 108), the RS decoded bit stream and the LDPC or turbo decoded bit stream may also be combined using a combiner 109 to generate an output bit stream that is a best estimate of the original input bit stream that is provided to the separator 108.

The manner in which the separator 108 and the combiner 109 operate needs to correlative, in that, the manner in which the separator 108 does in fact separate the input bit stream needs to be undone by the combiner 109. The bits of each of the bit streams may be separated/combined in an alternating manner (e.g., every other bit) or groups of each bit stream may be separated/combined as well without departing from the scope and spirit of the invention.

Referring to FIG. 2, this communication system 200 shows yet another possible embodiment that is operable to combine the beneficial error correction capabilities provided by both RS code and either turbo code or LDPC code.

If a communication system needs to perform with a very low BER (Bit Error Rate) (e.g., in a communication system that transmits video signals), the RS encoder 105 and the LDPC/turbo encoder 106 may be concatenated as needed. The main difference to the previous communication system 100 is the concatenation of a RS encoder 105 and LDPC/turbo encoder 106 with another convolutional interleaver, $\pi_2$ 211 in between them. A separator 208 is implemented to select certain of the RS coded bits output from the RS encoder 105 and provide them to the convolutional interleaver, $\pi_4$ 211. The convolutional interleaver, $\pi_4$ 211 can be a bit or RS code symbol interleaver without departing from the scope and spirit of the invention. It is clear in this embodiment that all of the bits of an input bit stream undergo RS encoding, yet only some of those RS coded bits then undergo LDPC or turbo encoding.

In addition, at the receiver side of the communication channel 199, care must be taken to account for the concatenation of the RS encoder 105 and the LDPC/turbo encoder 106 at the transmitter end of the communication channel 199. For example, a convolutional de-interleaver, $(\pi_4)^{-1}$ 252 is operable to de-interleave the LDPC or turbo decoded bit stream output from the LDPC/turbo decoder 146 before passing this signal to the interleaver, $\pi_2$ 111. Moreover, a combiner 258 is operable to combine the LDPC or turbo decoded bit stream output from the LDPC/turbo decoder 146 and the output bit stream from the de-interleaver, $(\pi_1)^{-1}$ 155 before passing this combined bit stream to the RS decoder 160.

Figure 3:
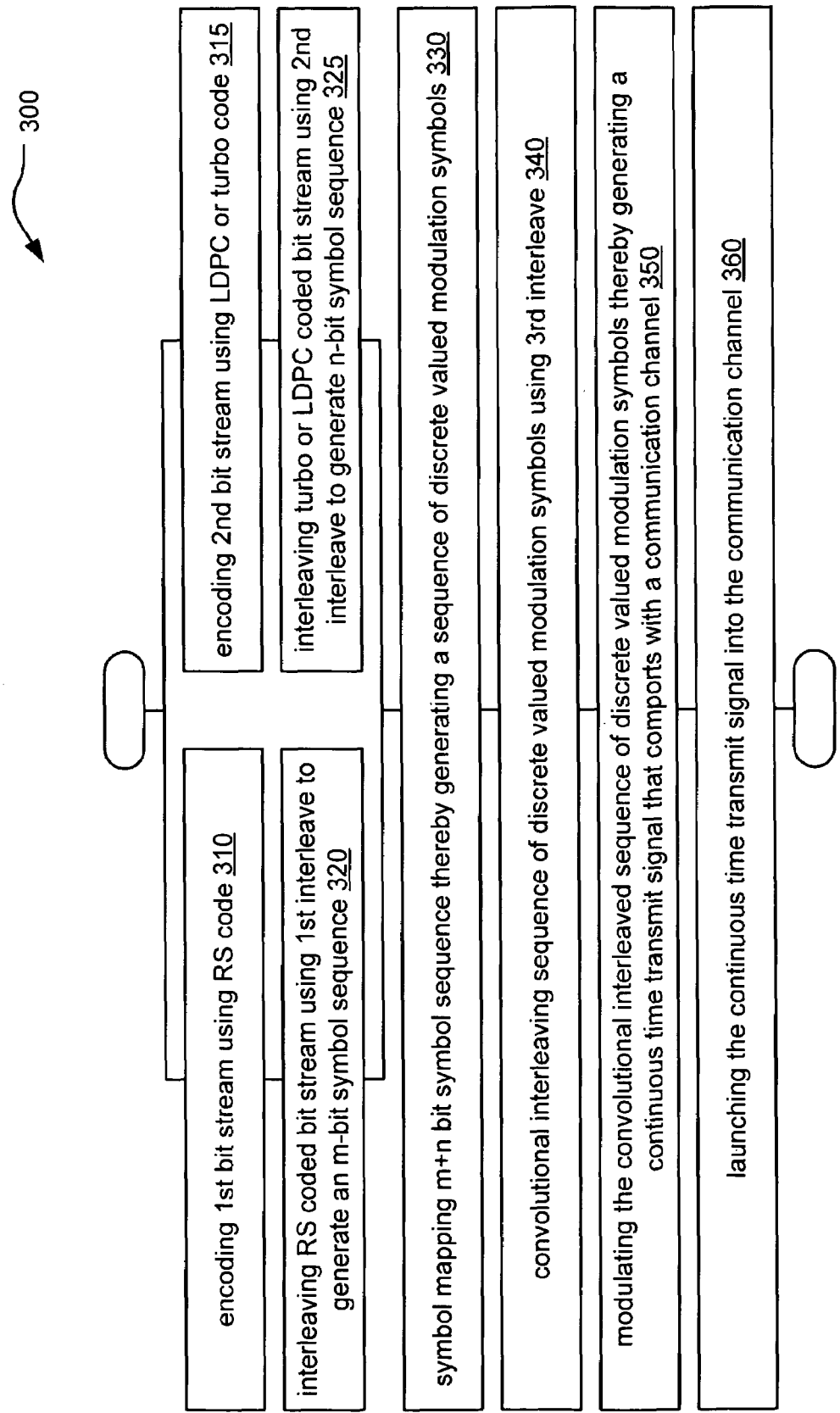
FIG. 3 and FIG. 4 are diagrams illustrating various embodiments of methods that are operable to generate continuous time transmit signals to be launched into a communication channel in accordance with certain aspects of the invention.
Figure 4:
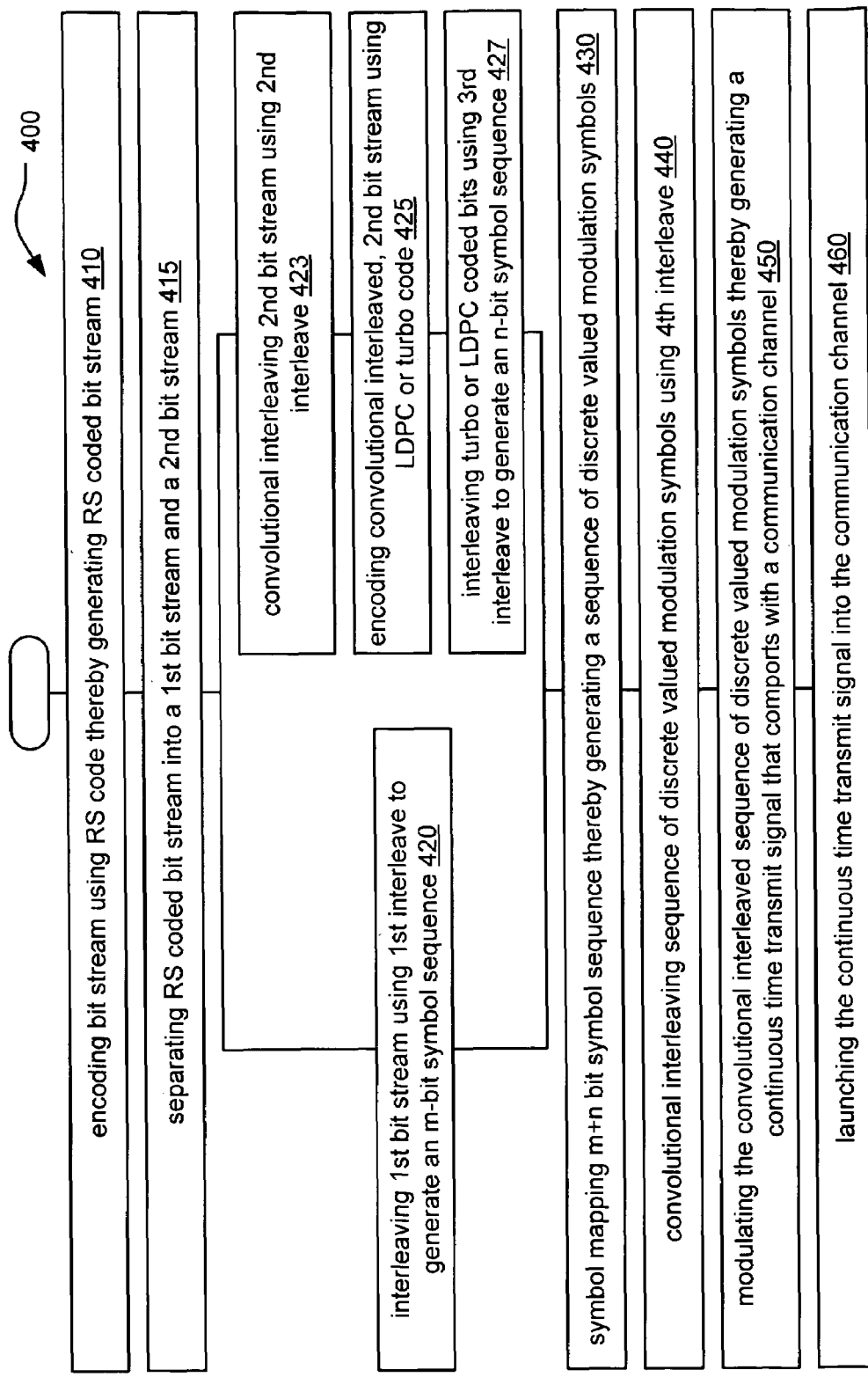

FIG. 3 and FIG. 4 are diagrams illustrating various embodiments of methods that are operable to generate continuous time transmit signals to be launched into a communication channel in accordance with certain aspects of the invention.

Referring to FIG. 3, this method 300 begins by performing several operations simultaneously and in parallel. For example, the method 300 begins by encoding a $1^{st}$ bit stream using RS code, as shown in a block 310. Then, the method continues by interleaving RS coded bit stream using 1st interleave to generate an m-bit symbol sequence, as shown in a block 320. In parallel operation to the operations of the blocks 310 and 320, the method 300 operates by encoding $2^{nd}$ bit stream using LDPC or turbo code, as shown in a block 315, and then interleaving turbo or LDPC coded bit stream using 2nd interleave to generate n-bit symbol sequence, as shown in a block 325.

Thereafter, the m-bit symbol sequence and the n-bit symbol sequence may be may be combined into a m+n bit symbol sequence. The method 300 then continues by symbol mapping m+n bit symbol sequence thereby generating a sequence of discrete valued modulation symbols, as shown in a block 330. The method then operates by convolutional interleaving sequence of discrete valued modulation symbols using a $3^{rd}$ interleave, as shown in a block 340. The method then operates by modulating the convolutional interleaved sequence of discrete valued modulation symbols thereby generating a continuous time transmit signal that comports with a communication channel, as shown in a block 350. Ultimately, the method 300 operates by launching the continuous time transmit signal into the communication channel, as shown in a block 360.

Referring to FIG. 4, this method 400 also begins by performing several operations simultaneously and in parallel. This method 400 allows for the concatenated RS and LDPC or turbo encoding of information. As described in some other embodiments above, all of the bits of an input bit stream undergo RS encoding, yet only some of those RS coded bits then undergo LDPC or turbo encoding.

This method 400 operates by encoding a bit stream using a RS code thereby generating a RS coded bit stream, as shown in a block 410. The method 400 then continues by separating the RS coded bit stream into a $1^{st}$ bit stream and a $2^{nd}$ bit stream, as shown in a block 415.

The method 400 may then continue by performing the operations of the block 420 and the blocks 423, 425, and 427 substantially in parallel and simultaneously.

In the block 420, the method 400 operates by interleaving the $1^{st}$ bit stream using a $1^{st}$ interleave to generate an m-bit symbol sequence. In the block 423, the method 400 operates by convolutional interleaving the $2^{nd}$ bit stream using a $2^{nd}$ interleave. In the block 425, the method 400 operates by encoding the convolutional interleaved, $2^{nd}$ bit stream using an LDPC or turbo code. In the block 427, the method 400 operates by interleaving the turbo or LDPC coded bits using a $3^{rd}$ interleave to generate an n-bit symbol sequence 427.

Thereafter, the method 400 operates by symbol mapping the m+n bit symbol sequence thereby generating a sequence of discrete valued modulation symbols, as shown in a block 430. The method 400 then continues by convolutional interleaving the sequence of discrete valued modulation symbols using a $4^{th}$ interleave, as shown in a block 440.

The method 400 then operates by modulating the convolutional interleaved sequence of discrete valued modulation symbols thereby generating a continuous time transmit signal that comports with a communication channel, as shown in a block 450. Ultimately, the method 400 operates by launching the continuous time transmit signal into the communication channel, as shown in a block 460.

Figure 5:
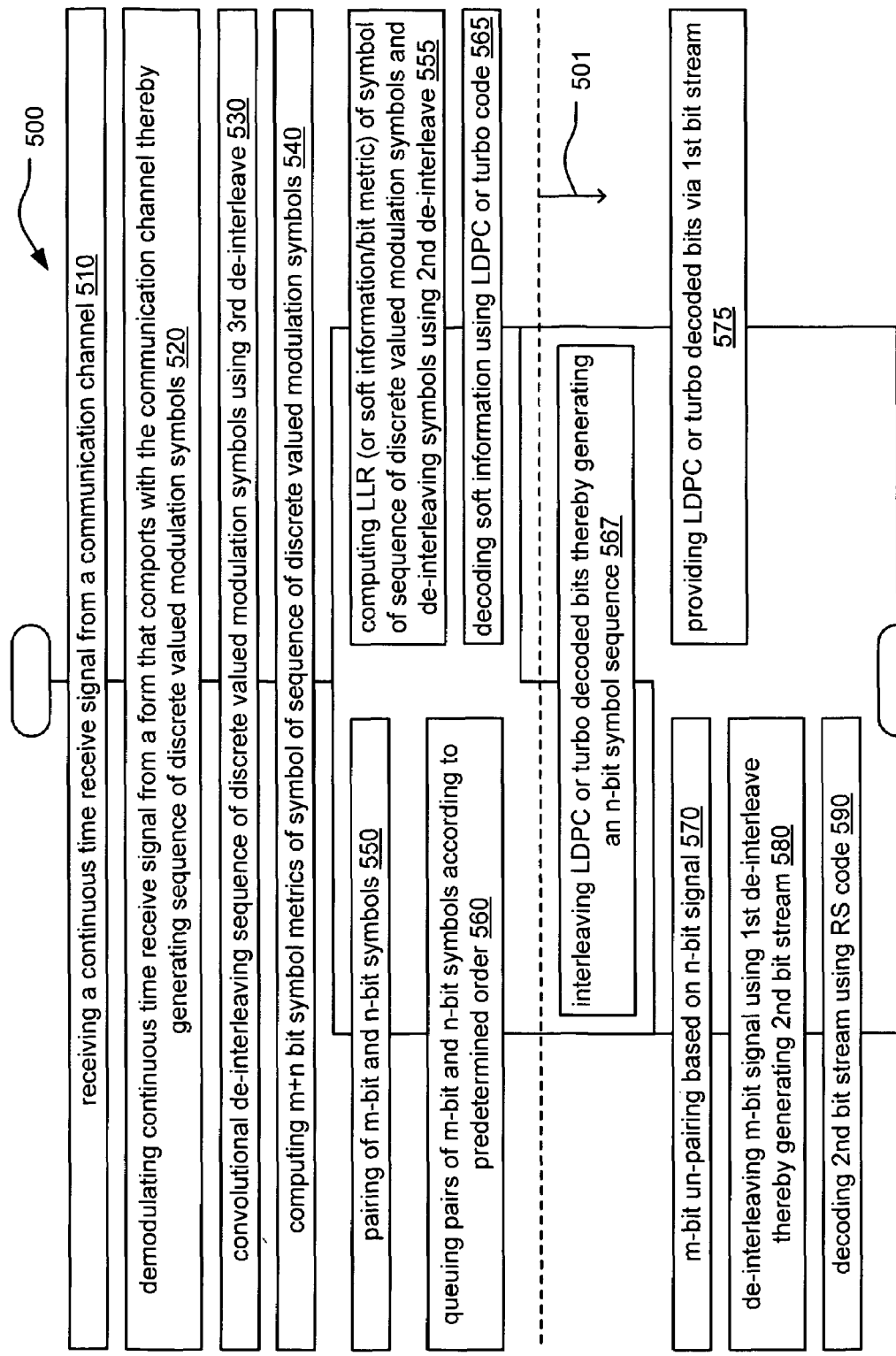
FIG. 5 and FIG. 6 are diagrams illustrating various embodiments of methods that are operable to process continuous time receive signals received from a communication channel in accordance with certain aspects of the invention.
Figure 6:
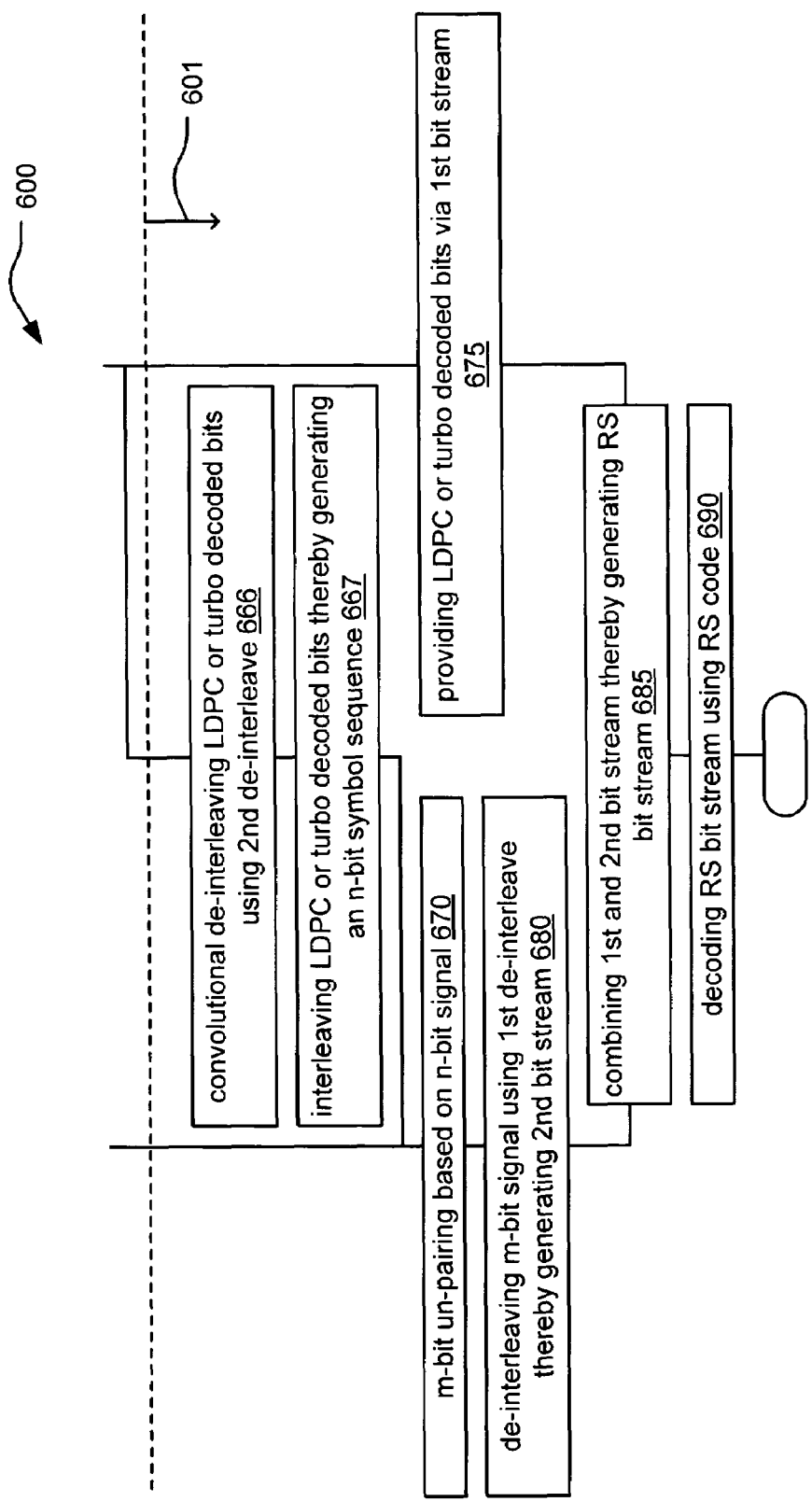

FIG. 5 and FIG. 6 are diagrams illustrating various embodiments of methods that are operable to process continuous time receive signals received from a communication channel in accordance with certain aspects of the invention.

Referring to FIG. 5, a method 500 begins by receiving a continuous time receive signal from a communication channel, as shown in a block 510. Then, the method 500 operates by demodulating the continuous time receive signal from a form that comports with the communication channel thereby, generating sequence of discrete valued modulation symbols, as shown in a block 520.

The method 500 then continues by convolutional de-interleaving sequence of discrete valued modulation symbols using $3^{rd}$ de-interleave, as shown in a block 530. The method then operates by computing m+n bit symbol metrics of symbol of sequence of discrete valued modulation symbols, as shown in a block 540.

The method 500 then continues by operating and performing several operations which may be performed substantially simultaneously and in parallel. The operations of the blocks 550 and 560 as well as the operations of the blocks 555 and 565 may be performed in parallel. In the block 550, the method 500 operates by pairing of m-bit and n-bit symbols is performed. In the block 560, the method 500 operates by queuing the pairs of the m-bit and n-bit symbols according to a predetermined order. This may be performed using a FIFO operation in some embodiments. In parallel, the method 500 operates by computing the LLR (or soft information/bit metric) of symbol of sequence of discrete valued modulation symbols and de-interleaving symbols using $2^{nd}$ de-interleave, as shown in a block 555. The method also operates by decoding soft information using the corresponding LDPC or turbo code by which the bits were originally encoded, as shown in a block 565. As shown in a block, the method 500 includes providing these LDPC or turbo decoded bits via a $1^{st}$ bit stream, as shown in a block 575.

The method also operates by interleaving the LDPC or turbo decoded bits thereby generating an n-bit symbol sequence, as shown in a block 567. Using this information as well as the pairings of the m-bit and n-bit symbols provided from the block 560.

The method 500 operates by performing the m-bit un-pairing based on n-bit signal, as shown in a block 570. The method then continues by de-interleaving the m-bit signal using a $1^{st}$ de-interleave thereby generating a $2^{nd}$ bit stream, as shown in a block 580. The method 500 also performs decoding the $2^{nd}$ bit stream using the RS code, as shown in a block 590.

As can be seen, the method 500 includes operations indicated as occurring after the line indicated by reference numeral 501.

Referring to FIG. 6, this diagram shows a method 600 that includes an embodiment 601 that is an alternative to the operations indicated by the reference numeral 501 of the preceding diagram. All of the operations performed above the line indicated by reference numeral 501 in the FIG. 5 may also be viewed as being performed above the line indicated by reference numeral 601 in the FIG. 6.

After performing all of the operations performed above the line indicated by reference numeral 501 in the FIG. 5, the method 600 continues by convolutional de-interleaving the LDPC or turbo decoded bits using a $2^{nd}$ de-interleave, as shown in a block 666. The method 600 then operates by interleaving the LDPC or turbo decoded bits thereby generating an n-bit symbol sequence, as shown in a block 667. Also, the LDPC or turbo decoded bits via 1st bit stream are provided, as shown in a block 675.

The method 600 then continues by performing the m-bit un-pairing based on n-bit signal, as shown in a block 670. The method 600 then continues by de-interleaving the m-bit signal using a $1^{st}$ de-interleave thereby generating a $2^{nd}$ bit stream, as shown in a block 680.

The method 600 then continues by combining the $1^{st}$ and the $2^{nd}$ bit stream thereby generating RS bit stream, as shown in a block 685. Ultimately, the method 600 operates by decoding the RS bit stream using a RS code, as shown in a block 690. It is noted here that the RS bit stream that is decoded includes some bits that have already been decoded according to the LDPC or turbo code (e.g., as shown in the block 565 within the FIG. 5).

It is also noted that the methods described within the preceding figures may also be performed within any number of appropriate system and/or apparatus designs (e.g., communication systems, communication transmitters, communication receivers, communication transceivers, and/or functionality) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
   a RS (Reed-Solomon) encoder that is operable to encode a first bit stream thereby generating a RS coded bit stream;
   a first interleaver that is operable to interleave the RS coded bit stream thereby generating an m-bit symbol sequence;
   an encoder that is operable to encode a second bit stream, using an LDPC (Low Density Parity Check) code or a turbo code, thereby generating an LDPC or turbo coded bit stream;
   a second interleaver that is operable to interleave the LDPC or turbo coded bit stream thereby generating an n-bit symbol sequence; and
   a symbol mapper that is operable to:
     receive the m-bit symbol sequence;
     receive the n-bit symbol sequence;
     combine selected m-bit symbols from the m-bit symbol sequence and selected n-bit symbols from the n-bit symbol sequence thereby generating an m+n bit symbol sequence; and
     symbol map the m+n bit symbol sequence according to a constellation having $2^{(m+n)}$ constellation points and a corresponding mapping of the $2^{(m+n)}$ constellation points thereby generating a sequence of discrete valued modulation symbols.

2. The apparatus of claim 1, further comprising:
   a convolutional interleaver that is operable to interleave the sequence of discrete valued modulation symbols thereby generating a scrambled sequence of discrete valued modulation symbols; and
   a modulator that is operable to:
     transform the scrambled sequence of discrete valued modulation symbols into a continuous time transmit signal that comports with a communication channel; and
     launch the continuous time transmit signal into the communication channel.

3. The apparatus of claim 2, wherein:
   the RS encoder is operable to introduce redundancy within the RS coded bit stream to enable error correction of burst error that may be incurred by the continuous time transmit signal within the communication channel.

4. The apparatus of claim 2, wherein:
   the encoder is operable to introduce redundancy within the LDPC or turbo coded bit stream to enable error correction of random errors that may be incurred by the continuous time transmit signal within the communication channel.

5. The apparatus of claim 1, further comprising:
   a separator that is operable to:
     receive an input bit stream; and partition the input bit stream into the first bit stream that is provided to the RS encoder and the second bit stream that is provided to the encoder that employs the LDPC or turbo code.

6. The apparatus of claim 5, wherein:
the separator is operable to select bits from the input bit stream such that:
   a first bit of the input bit stream is provided to the first bit stream;
   a second bit of the input bit stream is provided to the second bit stream;
   a third bit of the input bit stream is provided to the first bit stream; and
   a fourth bit of the input bit stream is provided to the second bit stream.

7. The apparatus of claim 5, wherein:
the separator is operable to select bits from the input bit stream such that:
   a first plurality of bits of the input bit stream is provided to the first bit stream;
   a second plurality of bits of the input bit stream is provided to the second bit stream;
   a third plurality of bits of the input bit stream is provided to the first bit stream; and
   a fourth plurality of bits of the input bit stream is provided to the second bit stream.

8. An apparatus, comprising:
a RS (Reed-Solomon) encoder that is operable to encode an input bit stream thereby generating a RS coded bit stream;
a separator that is operable to partition the RS coded bit stream into a first RS coded bit stream and a second RS coded bit stream;
a first interleaver that is operable to interleave the first RS coded bit stream thereby generating an m-bit symbol sequence;
a convolutional interleaver that is operable to interleave the second RS coded bit stream thereby generating a scrambled second RS coded bit stream;
an encoder that is operable to encode the scrambled second RS coded bit stream, using an LDPC (Low Density Parity Check) code or a turbo code, thereby generating an LDPC or turbo coded bit stream;
a second interleaver that is operable to interleave the LDPC or turbo coded bit stream thereby generating an n-bit symbol sequence; and
a symbol mapper that is operable to:
   receive the m-bit symbol sequence;
   receive the n-bit symbol sequence;
   combine selected m-bit symbols from the m-bit symbol sequence and selected n-bit symbols from the n-bit symbol sequence thereby generating an m+n bit symbol sequence; and
   symbol map the m+n bit symbol sequence according to a constellation having $2^{(m+n)}$ constellation points and a corresponding mapping of the $2^{(m+n)}$ constellation points thereby generating a sequence of discrete valued modulation symbols.

9. The apparatus of claim 8, further comprising:
at least one additional convolutional interleaver that is operable to interleave the sequence of discrete valued modulation symbols thereby generating a scrambled sequence of discrete valued modulation symbols;
a modulator that is operable to:
   transform the scrambled sequence of discrete valued modulation symbols into a continuous time transmit signal that comports with a communication channel; and
   launch the continuous time transmit signal into the communication channel.

10. The apparatus of claim 9, wherein:
the RS encoder is operable to introduce redundancy within the RS coded bit stream to enable error correction of burst error that may be incurred by the continuous time transmit signal within the communication channel.

11. The apparatus of claim 9, wherein:
the encoder is operable to introduce redundancy within the LDPC or turbo coded bit stream to enable error correction of random errors that may be incurred by the continuous time transmit signal within the communication channel.

12. The apparatus of claim 8, wherein:
the separator is operable to select bits from the RS coded bit stream such that:
   a first bit of the RS coded bit stream is provided to the first RS coded bit stream;
   a second bit of the RS coded bit stream is provided to the second RS coded bit stream;
   a third bit of the RS coded bit stream is provided to the first RS coded bit stream; and
   a fourth bit of the RS coded bit stream is provided to the second RS coded bit stream.

13. The apparatus of claim 8, wherein:
the separator is operable to select bits from the RS coded bit stream such that:
   a first plurality of bits of the RS coded bit stream is provided to the first RS coded bit stream;
   a second plurality of bits of the RS coded bit stream is provided to the second RS coded bit stream;
   a third plurality of bits of the RS coded bit stream is provided to the first RS coded bit stream; and
   a fourth plurality of bits of the RS coded bit stream is provided to the second RS coded bit stream.

14. A method, comprising:
encoding a first bit stream using a RS (Reed-Solomon) code thereby generating a RS coded bit stream;
interleaving the RS coded bit stream using a first interleave thereby generating an m-bit symbol sequence;
encoding a second bit stream using an LDPC (Low Density Parity Check) code or a turbo code thereby generating an LDPC or turbo coded bit stream;
interleaving the LDPC or turbo coded bit stream using a second interleave thereby generating an n-bit symbol sequence;
combining selected m-bit symbols from the m-bit symbol sequence and selected n-bit symbols from the n-bit symbol sequence thereby generating an m+n bit symbol sequence;
symbol mapping the m+n bit symbol sequence according to a constellation having $2^{(m+n)}$ constellation points and a corresponding mapping of the $2^{(m+n)}$ constellation points thereby generating a sequence of discrete valued modulation symbols;
convolutional interleaving the sequence of discrete valued modulation symbols thereby generating a scrambled sequence of discrete valued modulation symbols;
transforming the scrambled sequence of discrete valued modulation symbols into a continuous time transmit signal that comports with a communication channel; and
launching the continuous time transmit signal into the communication channel.

15. The method of claim 14, further comprising:
receiving an input bit stream; and
partitioning the input bit stream into the first bit stream that is provided to the RS encoder and the second bit stream that is provided to the encoder that employs the LDPC or turbo code.

16. The method of claim 15, wherein:
a first bit of the input bit stream is provided to the first bit stream;
a second bit of the input bit stream is provided to the second bit stream;
a third bit of the input bit stream is provided to the first bit stream; and
a fourth bit of the input bit stream is provided to the second bit stream.

17. The method of claim 15, wherein:
a first plurality of bits of the input bit stream is provided to the first bit stream;
a second plurality of bits of the input bit stream is provided to the second bit stream;
a third plurality of bits of the input bit stream is provided to the first bit stream; and
a fourth plurality of bits of the input bit stream is provided to the second bit stream.

18. A method, comprising:
encoding an input bit stream using a RS (Reed-Solomon) code thereby generating a RS coded bit stream;
separating the RS coded bit stream into a first RS coded bit stream and a second RS coded bit stream;
interleaving the first RS coded bit stream using a first interleave thereby generating an m-bit symbol sequence;
convolutional interleaving the second RS coded bit stream using a first convolutional interleave thereby generating a scrambled second RS coded bit stream;
encoding the scrambled second RS coded bit stream, using an LDPC (Low Density Parity Check) code or a turbo code, thereby generating an LDPC or turbo coded bit stream;
interleaving the LDPC or turbo coded bit stream using a second interleave thereby generating an n-bit symbol sequence; and
combining selected m-bit symbols from the m-bit symbol sequence and selected n-bit symbols from the n-bit symbol sequence thereby generating an m+n bit symbol sequence;
symbol mapping the m+n bit symbol sequence according to a constellation having $2^{(m+n)}$ constellation points and a corresponding mapping of the $2^{(m+n)}$ constellation points thereby generating a sequence of discrete valued modulation symbols;
convolutional interleaving the sequence of discrete valued modulation symbols using a second convolutional interleave thereby generating a scrambled sequence of discrete valued modulation symbols;
transforming the scrambled sequence of discrete valued modulation symbols into a continuous time transmit signal that comports with a communication channel; and
launching the continuous time transmit signal into the communication channel.

19. The method of claim 18, wherein:
a first bit of the RS coded bit stream is provided to the first RS coded bit stream;
a second bit of the RS coded bit stream is provided to the second RS coded bit stream;
a third bit of the RS coded bit stream is provided to the first RS coded bit stream; and
a fourth bit of the RS coded bit stream is provided to the second RS coded bit stream.

20. The method of claim 18, wherein:
a first plurality of bits of the RS coded bit stream is provided to the first RS coded bit stream;
a second plurality of bits of the RS coded bit stream is provided to the second RS coded bit stream;
a third plurality of bits of the RS coded bit stream is provided to the first RS coded bit stream; and
a fourth plurality of bits of the RS coded bit stream is provided to the second RS coded bit stream.

* * * * *